(12) United States Patent
Miyasyo

(10) Patent No.: US 6,201,689 B1
(45) Date of Patent: Mar. 13, 2001

(54) ELECTRONIC APPLIANCE

(75) Inventor: Hiroaki Miyasyo, Hino (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/203,636

(22) Filed: Dec. 1, 1998

(30) Foreign Application Priority Data

Dec. 5, 1997 (JP) .................................... 9-335667

(51) Int. Cl.[7] ............................... H05K 5/00; H05K 7/00
(52) U.S. Cl. ...................... 361/681; 361/789; 361/785; 361/749; 361/748
(58) Field of Search ................................ 361/784, 789, 361/785, 749, 748, 783, 681

(56) References Cited

U.S. PATENT DOCUMENTS

| | | | |
|---|---|---|---|
| 5,448,387 | * | 9/1995 | Kurokawa et al. ...................... 359/88 |
| 5,592,365 | * | 1/1997 | Sugimoto et al. .................... 361/789 |
| 5,717,556 | * | 2/1998 | Yanagida ................ 361/803 |
| 5,936,850 | * | 8/1999 | Takahashi et al. .................... 361/784 |

FOREIGN PATENT DOCUMENTS

| | | |
|---|---|---|
| 61-215528 | 9/1986 | (JP) . |
| 8-12352 | 2/1996 | (JP) . |

* cited by examiner

*Primary Examiner*—Leo P. Picard
*Assistant Examiner*—Tung Minh Bui
(74) *Attorney, Agent, or Firm*—Frishauf, Holtz, Goodman, Langer & Chick, P.C.

(57) ABSTRACT

A flexible printed substrate is connected to an LCD at one end thereof. To the other end, a thermocompression bonding terminal and a repair terminal (thermocompression bonding terminal for use in repairing) are arranged side by side and connected by means of thermocompression bonding with an anisotropic conductive bond interposed between them. On the other hand, a thermocompression bonding terminal of the main substrate is formed on an end of the main substrate so as to face the thermocompression bonding terminal of the flexible substrate. In addition, a repair terminal (a thermocompression bonding terminal for use in repairing) is formed in a close proximity to the thermocompression bonding terminal of the main substrate. In the case where thermocompression bonding between the thermocompression bonding terminals of the flexible substrate and the main substrate fails, only the unsuccessfully bonded portion is cut off and the repair terminals are newly connected by means of thermocompression bonding with an anisotropic conductive bond interposed between them.

16 Claims, 3 Drawing Sheets

ELECTRONIC APPLIANCE

BACKGROUND OF THE INVENTION

The present invention relates to an electrical connecting structure of a printed substrate.

With the recent tendency of miniaturization of electronic appliances, flexible printed substrates have been widely used. The flexible printed substrate is electrically connected by means of a contact structure using thermocompression bonding with a well known anisotropic conductive bond.

Such a contact structure is disclosed, for example, in Jpn. Pat. Appln. KOKOKU publication No. 8-12352. The disclosed contact structure has a connecting terminal electrode at the connecting portion between a flexible printed substrate and an LCD-mounting substrate or at the connecting portion between flexible printed substrates, and the bonding strength of the substrates is increased by dividing the contact electrode into two in a recess form.

However, the connecting structure formed by means of thermocompression bonding using anisotropic conductive bond set forth in the publication has a problem in that repair cannot be made when the flexible printed substrate fails in thermocompression bonding. In other words, only one type of connecting terminal is prepared for each usage as the connecting terminal to be formed on the regularly-employed flexible printed substrate, so that if the contact terminal fails in thermocompression bonding, the substrate must be discarded as a useless article.

However, since there are many cases in which an expensive electronic part such as a microprocessor is attached to the flexible substrate, costs may increase if the expensive electronic part is discarded every time the connecting terminal of the substrate fails in thermocompression bonding.

BRIEF SUMMARY OF THE INVENTION

An object of the present invention is to provide an electronic appliance whose printed substrate need not be discarded even if the connecting terminal of the substrate fails in thermocompression bonding.

A first object of the present invention is to provide an electronic appliance comprising:

an electronic part having a first connecting terminal;

a printed substrate having a second connecting terminal for electrically connecting to the first connecting terminal arranged on the electronic part; and a repair terminal, which is different from the connecting terminals, arranged on at least one of the electronic part and the printed substrate.

A second object of the present invention is to provide an electric appliance comprising:

an electronic part having a first connecting terminal;

a circuit substrate having a second connecting terminal and a control circuit of the electronic part mounted thereon; and a flexible printed substrate for electrically connecting the connecting terminal of the electronic part and the connecting terminal of the circuit substrate;

wherein a repair terminal, which is different from the connecting terminal, is provided on at least one of the electronic part, the circuit substrate, and the flexible printed substrate.

A third object of the present invention is to provide a liquid crystal display apparatus comprising:

a liquid crystal display device having a connecting terminal;

a main substrate having a repair pattern formed thereon and a driving circuit of the liquid crystal display device mounted thereon; and a relay flexible printed substrate for connecting the liquid crystal display device and the main substrate;

wherein the relay flexible printed substrate and the main substrate are connected to each other with an anisotropic conductive bond interposed therebetween.

A fourth object of the present invention is to provide an electric connecting device comprising:

a first printed substrate having a plurality of first electric contacts formed in line and a plurality of second electric contacts formed in line, in parallel to each other; and a second printed substrate having a plurality of first electric contacts formed in line and a plurality of second electric contacts formed in line, in parallel to each other;

wherein either the plurality of first electric contacts or the plurality of second electric contacts of the first printed substrate are in electrical contact with either the plurality of first electric contacts or the plurality of second electric contacts of the second printed substrate.

In the present invention, at least two-row patterns are prepared as thermocompression bonding patterns which serve as the connecting terminal of the main printed substrate, one for regular thermocompression bonding operation and the other for repair thermocompression bonding operation. When the thermocompression bonding operation using the regular pattern results in failure, the thermocompression bonding operation is performed again by use of the thermocompression bonding pattern for repairing selected from the two-row patterns. By virtue of the repair pattern, the printed substrate can be reused, with the result that unnecessary increase in cost is successfully prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, embodiments of the present invention will be explained with reference to the accompanying drawings.

Figure 1A:
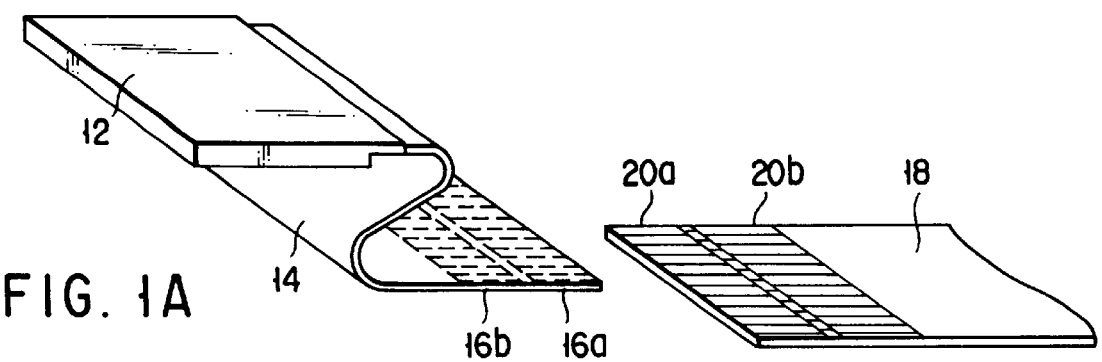
FIG. 1A is a perspective view of electronic parts according to the first embodiment of the present invention, showing a state before a relay flexible substrate is connected to a main substrate.
Figure 1B:
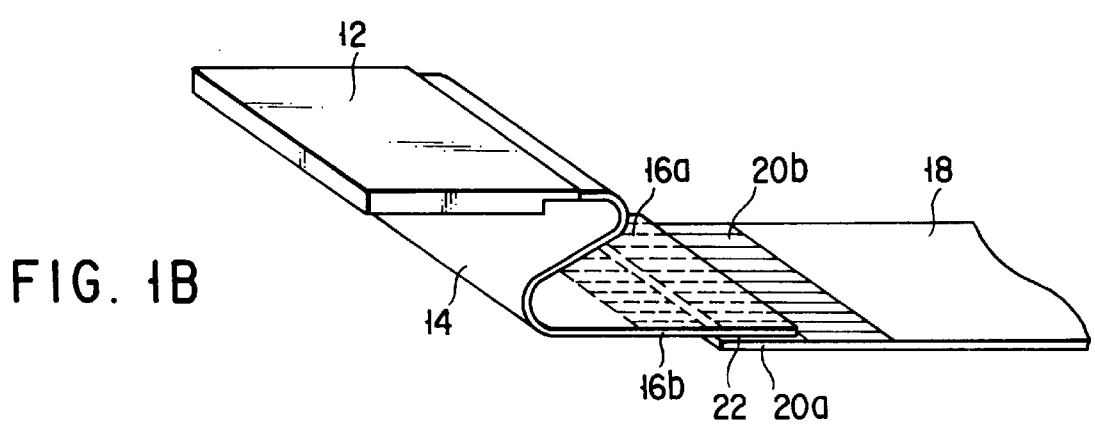
FIG. 1B is a perspective view of electronic parts according to the first embodiment of the present invention, showing a state in which thermocompression bonding terminals of the relay flexible substrate and the main substrate are connected to each other.
Figure 1C:
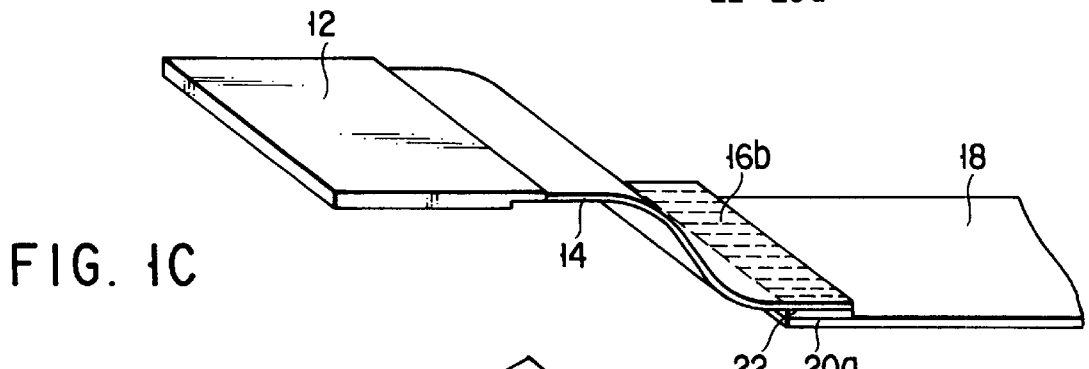
FIG. 1C is a perspective view of electronic parts according to the first embodiment of the present invention, showing a state in which repair terminals of the flexible substrate and the main substrate are connected to each other.

FIGS. 1A–1C are perspective views showing a part of an electronic appliance according to the first embodiment of the present invention.

FIG. 1A shows an electronic part, LCD 12 to which an end of a relay flexible substrate 14 is connected. At the other end of the relay flexible substrate 14, a regularly-used thermocompression bonding terminal 16a and a repair terminal 16b (thermocompression bonding terminal for use in repairing) are linearly formed side by side as connecting terminals.

On the other hand, on a main printed substrate 18 equipped with a microprocessor (not shown) etc., a regularly-used thermocompression bonding terminal 20a and a repair terminal 20b (thermocompression bonding terminal for use in repairing) are linearly formed side by side as connecting terminals.

Figure 2:
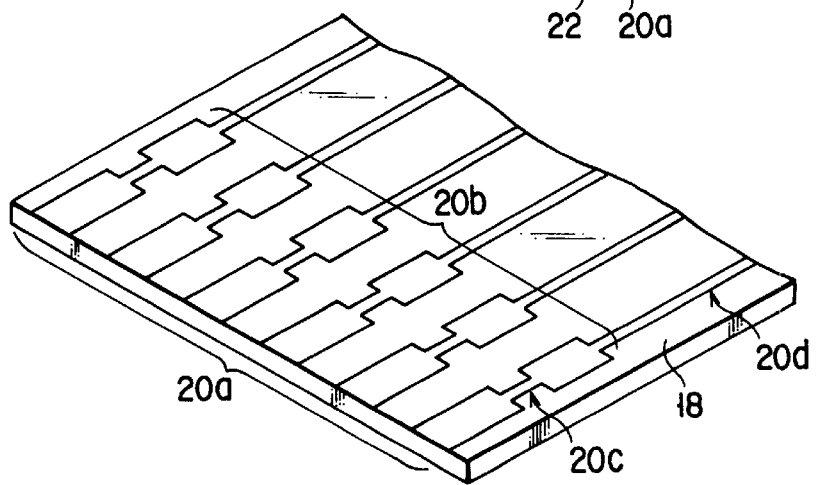
FIG. 2 is a view showing a structure of thermocompression bonding terminal and the repair terminal formed on the main printed substrate of FIG. 1A.

FIG. 2 is a view showing an example of a structure of the thermocompression bonding terminal 20a and the repair terminal 20b, in detail. As is apparent from FIG. 2, each of the thermocompression bonding terminal 20a and the repair terminal 20b comprises a plurality of patterns arranged in line on the main printed substrate. The patterns of terminals 20a are connected to the corresponding patterns of the terminals 20b by means of a conductive pattern 20c. The repair terminal 20b is connected to a circuit (not shown) on the main printed substrate 18 by a conductive pattern 20d.

Note that the structure comprising the thermocompression bonding terminal 20a and the repair terminal 20b is taken as an example and explained herein. However, the thermocompression bonding terminal 16a and the repair terminal 16b are also constructed on the relay flexible substrate 14 in the similar manner.

The thermocompression bonding terminals 16a and 20a are formed so as to face each other. Furthermore, the repair terminals 16b and 20b are formed in the same planes as the thermocompression bonding terminals 16a and 20a, respectively.

As shown in FIG. 1B, the thermocompression bonding terminal 16a of the relay flexible substrate 14 and the thermocompression bonding terminal 20a of the main printed substrate 18 thus constructed are aligned with each other. Both terminals 16a and 20a are then connected by means of thermocompression bonding with an anisotropic conductive bond 22 interposed between them. In this case, nothing is connected to the repair terminals 16b and 20b.

If the connection between the thermocompression bonding terminals 16a and 20a fails for any reason, the following operation is performed.

The portion at which the thermocompression bonding terminals 16a and 20a connected to each other is first cut off. Subsequently, the repair terminal 16b, which is brought to an end of the relay flexible substrate 14 by cutting off the thermocompression bonding terminals 16a therefrom, aligned with the repair terminal 20b, which is also brought to an end of the main substrate 18 by cutting off the thermocompression bonding terminals 20a therefrom.

Thereafter, the repair terminals 16b and 20b thus aligned are connected by means of thermocompression bonding with the anisotropic conductive bond 22 interposed between them in order to connect the relay flexible substrate 14 to the main printed substrate 18, as shown in FIG. 1C.

When the connection between the regularly-used thermocompression bonding terminals results in failure, the substrate can be subjected to a new thermocompression bonding operation after only the unsuccessfully connected portion of the thermocompression bonding terminals is cut off. Hence, the substrate may not be discarded unnecessarily.

Now, referring to FIGS. 3A and 3B, the second embodiment of the present invention will be explained.

Figure 3A:
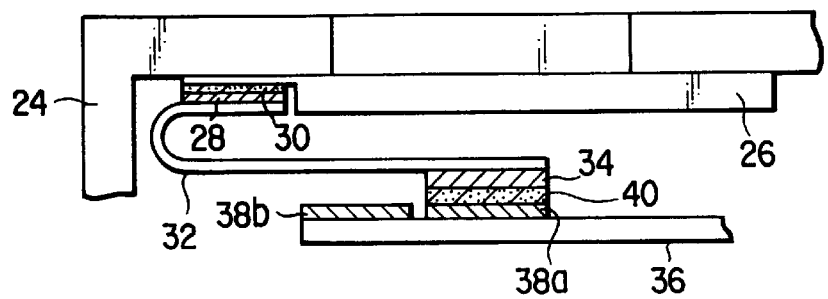
FIG. 3A is a sectional side view of an electronic appliance according to the second embodiment of the present invention, showing a state in which thermocompression bonding terminals of the relay flexible substrate and the main substrate are connected to each other.
Figure 3B:
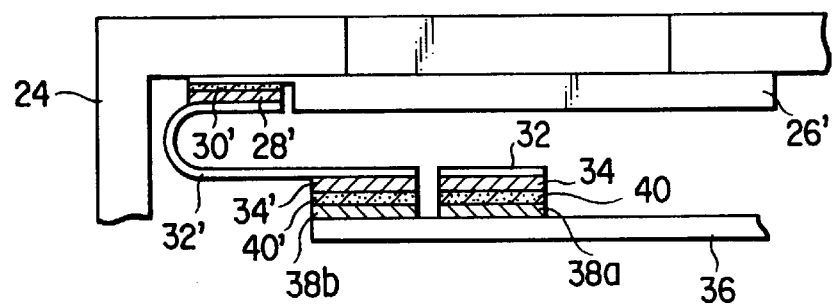
FIG. 3B is a sectional side view of an electronic appliance according to the second embodiment of the present invention, showing a state in which the relay flexible substrate is connected to the main substrate by use of the repair terminal.

FIGS. 3A and 3B are sectional side views of an electronic appliance according to the second embodiment of the present invention.

In FIG. 3A, an LCD 26 is attached along the inside of an exterior portion 24 of the electronic appliance. To an end of the LCD 26, a relay flexible substrate 32 is connected by means of thermocompression bonding using the thermocompression bonding terminal 28 arranged at one end thereof with an anisotropic conductive bond 30 interposed between them. A thermocompression bonding terminal 34 is formed at the other end of the relay flexible substrate 32 to connect it to the main substrate 36.

On the other hand, the main substrate 36 is equipped with a microprocessor (not shown) etc. A regularly-used thermocompression bonding terminal 38a and a repair terminal 38b (thermocompression bonding terminal for use in repairing) are linearly arranged side by side at an end of the main substrate 36 so as to face the thermocompression bonding terminal 34 formed on the relief flexible substrate 32. In this case, the repair terminal 38b is formed closer to the end of the main substrate 36 than the thermocompression bonding terminal 38a.

In the second embodiment, the relay flexible substrate 32 has a low degree of freedom with respect to shape due to lack of space, as shown in the figure.

The thermocompression bonding terminal 34 of the relay flexible substrate 32 and the thermocompression bonding terminal 38a of the main substrate 36 are aligned with each other and then connected by means of thermocompression bonding with an anisotropic conductive bond 40 interposed between them. In this case, nothing is connected to the repair terminals 38b.

If the connection between the thermocompression bonding terminals 34 and 38a fails for any reason, the following operation is performed since the relay flexible substrate 32 has a low degree of freedom with regard to shape due to lack of space in the second embodiment.

First, the relay flexible substrate 32 is cut off while leaving only the portion at which the thermocompression bonding terminal 34 is connected to the thermocompression bonding terminal 38a of the main substrate 36. Furthermore, the LCD 26 including the relay flexible substrate 32 from which the thermocompression bonding terminal 34 is removed, is removed from the exterior 24 and discarded.

Subsequently, an LCD 26' having the relay flexible substrate 32' for repairing, connected thereto, is attached to the exterior 24. More specifically, a selectively prepared relay flexible substrate 32' is connected to an end of the LCD 26' by means of thermocompression bonding via the thermocompression bonding terminal 28' formed at the end with an anisotropic conductive bond 30'.

The relay flexible substrate 32' has been previously prepared exclusively for use in repairing since the relay flexible substrate of an electronic appliance to be used has a low degree of freedom with respect to shape due to lack of space. In this case, the relay flexible substrate 32' for repairing is formed shorter by the length corresponding to the thermocompression bonding terminal 34 in comparison with the relay flexible substrate 32 regularly employed.

Then, the thermocompression bonding terminal 34' formed at the other end of the relay flexible substrate 32' for use in repairing, is aligned with the repair terminal 38b arranged on an end of the main substrate 36.

Subsequently, the thermocompression bonding terminal 34' and the repair terminal 38b are connected by means of thermocompression bonding with an anisotropic conductive bond 40' interposed between them, with the result that the relay flexible substrate 32' is connected to the main substrate 36, as shown in FIG. 3B.

As mentioned above, in the second embodiment, when the connection of the regularly-used thermocompression bonding terminals fails in the case where the relay flexible substrate of the electronic appliance to be used has a low degree of freedom with respect to shape due to lack of space, only the unsuccessfully connected portion of thermocompression bonding terminals is cut off. Since the out-of-use relay flexible substrate 32' and the LCD 26' are discarded in this manner, the thermocompression boding between the relay flexible substrate 32' for repairing and the LCD 26 can be newly performed. The main substrate equipped with an expensive electronic part such as a microprocessor may not be discarded unnecessarily.

Figure 4A:
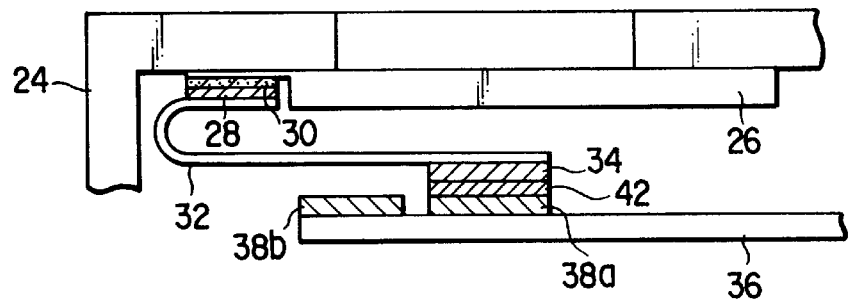
FIG. 4A is a sectional side view of an electronic appliance showing a modified example of the second embodiment of the present invention in which the thermocompression bonding terminals of the relay flexible substrate and the main substrate are connected with solder.

In the second embodiment mentioned above, the thermocompression bonding terminal is connected to the repair terminal by means of thermocompression bonding using an anisotropic conductive bond. However, the present invention is not limited to this. For example, the thermocompression bonding terminal and the repair terminal may be electrically connected with solder, as shown in, for example, FIGS. 4A and 4B. In this case, the relay flexible substrate 32 is cut off while leaving only the portion at which the thermocompression bonding terminal 34 is connected to the thermocompression bonding terminal 38a of the main substrate 36 with solder 42, in the same manner as in the second embodiment. Thus, the LCD 26 including the relay flexible substrate 32 from which the thermocompression bonding terminal 34 is cut off, is removed from the exterior 24 and discarded.

Figure 4B:
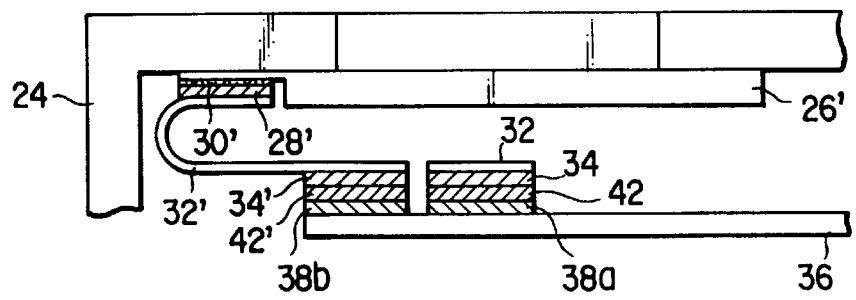
FIG. 4B is a sectional side view of an electronic appliance showing a modified example of the second embodiment of the present invention in which the relay flexible substrate and the main substrate are connected to each other with solder by use of the repair terminal.

The LCD 26' having the relay flexible substrate 32' for repairing connected thereto is attached to the exterior 24. Then, the thermocompression bonding terminal 34' formed on an end of the relay flexible substrate 32' for use in repairing is aligned with the repair terminal 38b arranged at an end of the main substrate 36. Thereafter, the thermocompression bonding terminal 34' and the repair terminal 38b thus aligned are connected with solder 42'. In this way, the relay flexible substrate 32' and the main substrate 36 are connected as shown in FIG. 4B.

The other structural elements of the modified example are the same as in the second embodiment shown in FIGS. 3A and 3B.

Next, the third embodiment of the present invention will be explained.

Figure 5A:
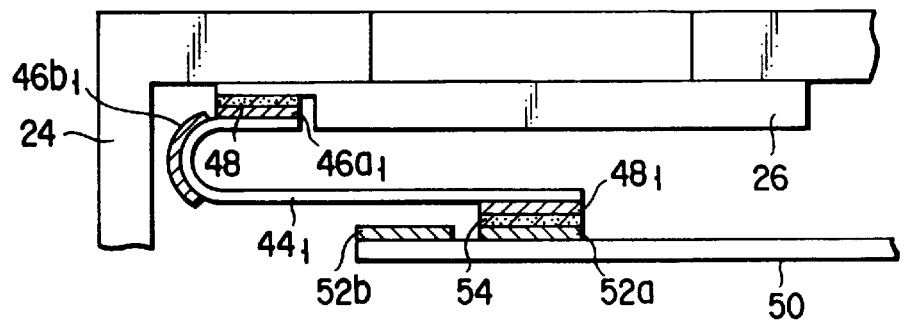
FIG. 5A is a sectional side view of an electronic appliance according to the third embodiment of the present invention in which the thermocompression bonding terminals of the relay flexible substrate and the main substrate are connected.
Figure 5B:
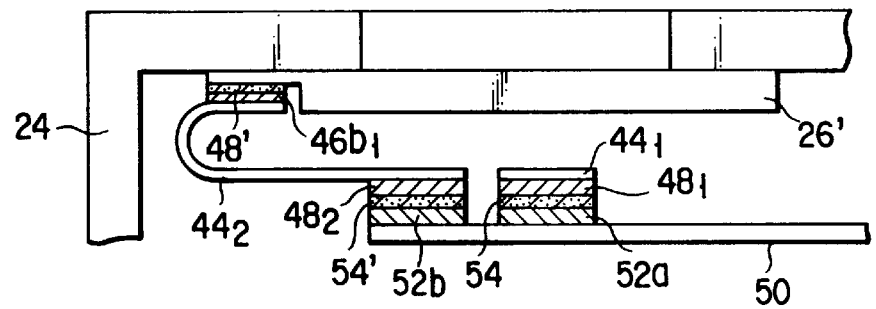
FIG. 5B is a sectional side view of an electronic appliance according to the third embodiment of the present invention in which the relay flexible substrate and the main substrate are connected of each other by means of the repair terminal.

FIGS. 5A and 5B are sectional side views of an electronic appliance according to the third embodiment of the present invention.

In FIG. 5A, the LCD 26 is attached along the inside of an exterior portion 24 of an electronic appliance. A relay flexible substrate $44_1$ is connected to an end of the LCD 26 by means of thermocompression bonding using thermocompression bonding terminal $46a_1$ attached to an end of the LCD 26, with an anisotropic conductive bond 48 interposed between them.

A repair terminal $46b_1$ (serving as a thermocompression bonding terminal for repairing) is arranged near the thermocompression bonding terminal $46a_1$ on the same plane at the end of the relay flexible substrate $44_1$. On the other end of relay flexible substrate $44_1$, a thermocompression bonding terminal $48_1$ is formed for connecting to the main substrate 50.

On the other hand, the main substrate 50 is equipped with a microprocessor (not shown) etc. On an end of the main substrate 50, a regularly-used thermocompression bonding terminal 52a and a repair terminal 52b (serving as the thermocompression bonding terminal for repairing) are linearly formed side by side so as to face the thermocompression bonding terminal $48_1$ formed on the relay flexible substrate $44_1$. In this case, the repair terminal 52b is formed closer to the end than the thermocompression bonding terminal 52a.

Also in the third embodiment, the relay flexible substrate $44_1$ has a low degree of freedom with respect to shape due to lack of space, in the same as in the second embodiment.

The thermocompression bonding terminal $48_1$ of the relay flexible substrate $44_1$ and the thermocompression bonding terminal 52a of the main substrate 50 thus constructed, are aligned with each other and connected by means of thermocompression bonding with an anisotropic conductive bond 54 interposed between them. In this case, nothing is connected to the repair terminal 52b.

Next, we will explain an operation to be performed in the case where the connection of the thermocompression bonding terminal $48_1$ and $52a$ fails for any reason.

First, the portion of the relay flexible substrate $44_1$ which is connected to the LCD 26 via the thermocompression bonding terminal $46a_1$, is cut off together with the LCD 26, while leaving the portion of the relay flexible substrate $44_1$ to which the thermocompression bonding terminal $48_1$ (which is connected to the main substrate 50 via the thermocompression terminal $52a$) is connected. The portion of the relay flexible substrate $44_1$ thus cut off is removed from the exterior 24 and discarded.

Subsequently, the thermocompression bonding terminal (not shown) of another relay flexible substrate $44_2$ previously formed is cut off. The repair terminal $46b_2$ of the relay flexible substrate $44_2$ is connected to one end of another LCD 26' by means of thermocompression bonding with an anisotropic conductive bond 54' interposed between them. Then, the LCD 26' having the relay flexible substrate $44_2$ connected thereto, is attached to the exterior 24.

On the other hand, the repair terminal 52b of the main substrate 50 is then aligned with the thermocompression bonding terminal $48_2$ of the relay flexible substrate $44_2$, and both terminals are connected by thermocompression bonding with the anisotropic conductive bond 54' interposed between them. In this case, the thermocompression bonding terminals $48_1$ and $52a$ unsuccessfully connected still remain on the main substrate 50.

As described, in the third embodiment, when the regularly-used thermocompression bonding terminals are connected unsuccessfully in the case where the relay flexible substrate of the electronic appliance to be used has a low degree of freedom with respect to shape due to lack of space, the portion of the thermocompression bonding terminal unsuccessfully connected is cut off. Since the out-of-use relay flexible substrate $44_1$ and the LCD 26 are discarded in this way, the thermocompression bonding can be made again by use of a new relay flexible substrate $44_2$ and the LCD 26'. Hence, the main substrate equipped with an expensive electronic part such as a microprocessor may not be discarded unnecessarily, in the same as in the second embodiment.

In the second embodiment, a relay flexible substrate for repairing must be formed separately. However, in the third embodiment, only one type of relay flexible substrate may be prepared and only the portion of the thermocompression bonding terminal connected to the LCD by thermocompression bonding may be cut off as the occasion requires. Hence, the third embodiment is effective in reducing costs without increasing the number of types of the relay flexible substrates.

Note that, in the first to third embodiments, one repair terminal is employed other than the regularly-used thermocompression bonding terminal. The present invention is not limited to this. A plurality of repair terminals may be used.

Furthermore, in the aforementioned embodiments, the relay flexible substrate to which the LCD is connected with heat, is selected to discard after the connection by means of the thermocompression bonding terminals fails. However, the present invention is not limited to this. For example, a substrate to be reused may be selected in consideration of a manufacturing cost. More specifically, the reusable substrate should be selected on the basis which of the relay flexible substrate or the main substrate has a more expensive electronic part attached thereto. The repair terminal may be formed on the substrate selected based upon the aforementioned point. It goes without saying that the repair terminal may be formed either of the substrates.

Figure 6A:
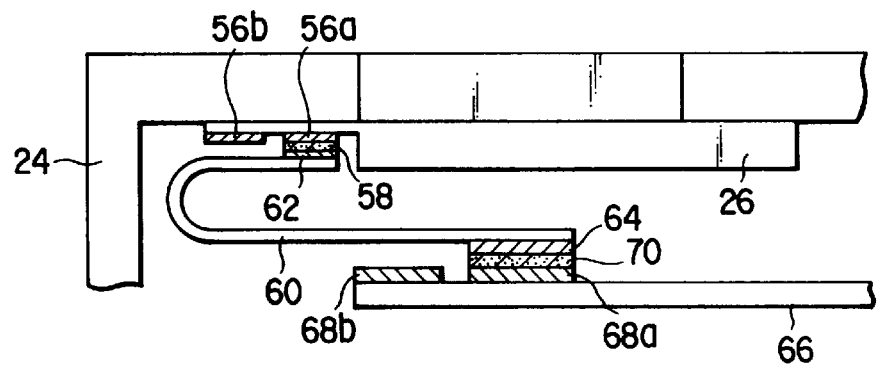
FIG. 6A is a sectional side view of an electronic appliance according to the fourth embodiment of the present invention in which the thermocompression bonding terminals of the relay flexible substrate and the main substrate are connected to each other.
Figure 6B:
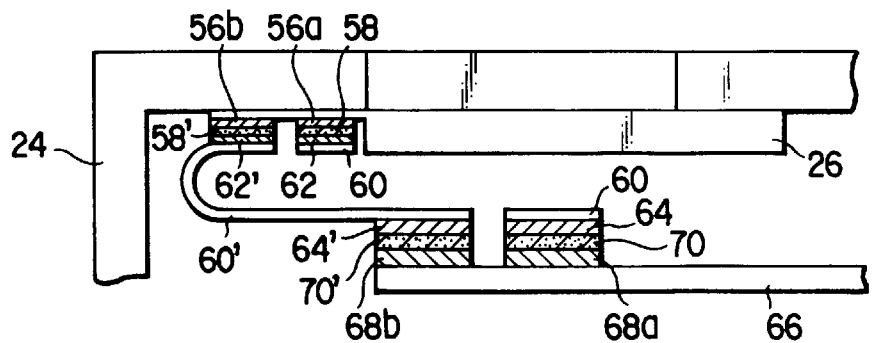
FIG. 6B is a sectional side view of an electronic appliance according to the fourth embodiment of the present invention in which the relay flexible substrate and the main substrate are connected by use of the repair terminal.

FIGS. 6A and 6B are sectional side views of an electronic appliance according to the fourth embodiment of the present invention.

In FIG. 6A, the LCD 26 is provided along the inside of the exterior portion 24 of an electronic appliance. A regularly-employed thermocompression bonding terminal 56a and a repair terminal 56b (serving as the thermocompression bonding terminal for repairing) are arranged linearly side by side at one end of the LCD 26. In this case, the repair terminal 56b is formed closer to the end than the thermocompression bonding terminal 56a.

To the thermocompression bonding terminal 56a, the thermocompression bonding terminal 62 formed at an end of the relay flexible substrate 60, is connected by means of thermocompression bonding with an anisotropic conductive bond 58 interposed between them. A thermocompression bonding terminal 64 is formed at the other end of the relay flexible substrate 60, for connecting to the main substrate 66.

On the other hand, the main substrate 66 is equipped with a microprocessor (not shown) etc. A regularly-used thermocompression bonding terminal 68a and a repair terminal 68b (a thermocompression bonding terminal for use in repairing) are arranged linearly side by side so as to face the thermocompression bonding terminal 64 formed on the relay flexible substrate 60. In this case, the repair terminal 68b is formed closer to an end than the thermocompression bonding terminal 68a.

Note that the relay flexible substrate 60 has a low degree of freedom with respect to shape due to lack of space in the fourth embodiment, as shown in the figure.

The thermocompression bonding terminal 62 of the relay flexible substrate 60 thus constructed and the thermocompression bonding terminal 56a formed on the LCD 26 are aligned with each other and connected by thermocompression bonding with the anisotropic conductive bond 58 interposed between them. In this case, nothing is connected to the repair terminal 56b. In the same manner, the thermocompression bonding terminal 64 of the relay flexible substrate 60 and the thermocompression bonding terminal 68a of the main substrate 66 are aligned with each other and connected by means of thermocompression bonding with an anisotropic conductive bond 70 interposed between them. In this case, nothing is connected to the repair terminal 68b.

When the connections between the thermocompression bonding terminals 62 and 56a and between the thermocompression bonding terminals 64 and 68a fail for any reason, the following operation will be performed since the relay flexible substrate 60 has a low degree of freedom with regard to shape in the fourth embodiment.

First, the relay flexible substrate 60 is cut off while leaving only the portion at which the thermocompression bonding terminal 62 is connected to the thermocompression bonding terminal 56a of the LCD 26. Similarly, the relay flexible substrate 66 is cut off while leaving only the portion at which the thermocompression bonding terminal 68a is connected to the thermocompression bonding terminal 64. The relay flexible substrate 60 from which the thermocompression bonding terminals 62 and 64 are cut off, is removed from the exterior 24 and discarded.

Subsequently, the thermocompression bonding terminal 62' arranged on an end portion of the relay flexible substrate 60' for use in repairing is aligned with the repair terminal 56b on the LCD 26. Thereafter, the thermocompression bonding terminal 62' and the repair terminal 56b thus aligned are connected by means of thermocompression bonding with an anisotropic conductive bond 58' interposed between them.

Similarly, a thermocompression bonding terminal 64' formed on the other end of the relay flexible substrate 60' for use in repairing, is aligned with a repair terminal 68b arranged on the end of the main substrate 66. Thereafter, the thermocompression bonding terminal 64' and the repair terminal 68b thus aligned are connected by means of thermocompression bonding with an anisotropic conductive bond 70' interposed between them. As a result, the LCD 26 is connected to the main substrate 66 with the relay flexible substrate 60' interposed between them, as shown in FIG. 6B.

In this case, the relay flexible substrate 60' is previously prepared exclusively for use in repairing since the relay flexible substrate of the electronic appliance to be used has a low degree of freedom with regard to shape due to lack of space. In this case, the relay flexible substrate 60' is short by the length corresponding to the thermocompression bonding terminals 62 and 64 in comparison with the regularly-used relay flexible substrate 60.

When the connection between the regularly-used thermocompression bonding terminals fails in the case where the relay flexible substrate of the electronic appliance to be used has a low degree of freedom with respect to shape due to lack of space in the fourth embodiment, only the unsuccessfully connected portion of the thermocompression bonding terminals is cut off. Since only the out-of-order relay flexible substrate 60 is discarded in this way, thermocompression bonding is newly performed by use of the relief flexible substrate 60' for repairing. Hence, the main substrate and the LCD equipped with an expensive electronic part such as a microprocessor need not be discarded unnecessarily.

As described in the foregoing, according to the present invention, it is possible to provide an electronic appliance printed substrate need not be discarded even if the thermocompression bonding of the connection terminals fails.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic appliance comprising:
    an electronic part having a first connecting terminal;
    a printed substrate having a second connecting terminal that is electrically connected to the first connecting terminal of the electronic part to establish an electrical connection between the electronic part and the printed substrate; and
    a repair terminal, which is different from the first and second connecting terminals, arranged on at least one of the electronic part and the printed substrate, said repair terminal being substitutable for one of the first and second connecting terminals to maintain the electrical connection between the electronic part and the printed substrate.

2. The electronic appliance according to claim 1, wherein the first connecting terminal of the electronic part is connected to the second connecting terminal of the printed substrate with an anisotropic conductive bond interposed therebetween.

3. The electronic appliance according to claim 1, wherein the first connecting terminal of the electronic part is connected to the second connecting terminal of the printed substrate by means of thermocompression bonding with an anisotropic conductive bond interposed therebetween.

4. The electronic appliance according to claim 1, wherein the first connecting terminal of the electronic part is connected to the second connecting terminal of the printed substrate with solder interposed therebetween.

5. The electronic appliance according to claim 1, wherein the electronic part comprises a display device.

6. The electronic appliance according to claim 1, wherein the repair terminal has a same electrical function as the first and second connecting terminals.

7. The electronic appliance according to claim 1, wherein the first and second connecting terminals and the repair terminal have a plurality of first electric contacts formed in line and a plurality of second electric contacts formed in a line which is an extension of the line in which the first electric contacts are formed, said second electric contacts also being arranged in parallel to the first electric contacts.

8. The electronic appliance according to claim 1, wherein a microprocessor is arranged on the printed substrate.

9. The electronic appliance according to claim 1, wherein the repair terminal is formed closer to an end side of the at least one of the electronic part and the printed substrate on which the repair terminal is arranged than the first and second connecting terminals of the at least one of the electronic part and the printed substrate on which the repair terminal is arranged.

10. An electronic appliance comprising:
    an electronic part having a first connecting terminal;
    a circuit substrate having a second connecting terminal and a control circuit of the electronic part mounted thereon; and
    a flexible printed substrate that electrically connects the first connecting terminal of the electronic part and the second connecting terminal of the circuit substrate to establish an electrical connection between the electronic part and the circuit substrate;
    wherein a repair terminal, which is different from the first and second connecting terminals, is provided on at least one of the electronic part, the circuit substrate, and the flexible printed substrate said repair terminal being substitutable for one of the first and second connecting terminals to maintain the electrical connection between the electronic part and the circuit substrate.

11. The electronic appliance according to claim 10, wherein the first and second terminals are connected to each other with an anisotropic conductive bond interposed therebetween.

12. The electronic appliance according to claim 10, wherein the first terminal of the electronic part is connected to the second terminal of the circuit substrate by means of thermocompression bonding with an anisotropic conductive bond interposed therebetween.

13. The electronic appliance according to claim 10, wherein the electronic part comprises a display device.

14. The electronic appliance according to claim 10, wherein the repair terminal has a same electrical function as the first and second connecting terminals.

15. The electronic appliance according to claim 10, wherein the first and second connecting terminals and the repair terminal have a plurality of first electric contacts formed in line and a plurality of second electric contacts formed in a line which is an extension of the line in which the first electric contacts are formed, said second electric contacts also being arranged in parallel to the first electric contacts.

16. The electronic appliance according to claim 10, wherein a microprocessor is arranged on the circuit substrate.

\* \* \* \* \*